United States Patent [19]

Carangelo

[11] Patent Number: 5,285,167
[45] Date of Patent: Feb. 8, 1994

[54] METHOD AND APPARATUS FOR SIGNAL COMPRESSION

[75] Inventor: Robert M. Carangelo, Glastonbury, Conn.

[73] Assignee: On-Line Technologies, Inc., East Hartford, Conn.

[21] Appl. No.: 917,859

[22] Filed: Jul. 22, 1992

[51] Int. Cl.[5] .......................... H03F 3/38; H01J 40/14; G01B 9/02

[52] U.S. Cl. ................... 330/10; 250/214 A; 330/110; 356/345

[58] Field of Search ............. 330/10, 110; 250/214 A, 250/214 DC; 328/142; 307/490; 333/14; 356/345

[56] References Cited

U.S. PATENT DOCUMENTS

| | | | |
|---|---|---|---|
| 4,349,787 | 9/1982 | Laupman | 330/284 |
| 4,400,583 | 8/1983 | Bloy | 179/1 D |
| 4,465,978 | 8/1984 | Helmstetter | 328/168 |
| 4,627,094 | 12/1986 | Scholz | 38/61 |
| 4,677,645 | 6/1987 | Kaniwa et al. | 333/14 X |
| 4,710,727 | 12/1987 | Rutt | 330/110 |
| 4,899,115 | 2/1990 | Christian | 330/302 |
| 4,940,947 | 7/1990 | McCartney et al. | 333/14 X |

*Primary Examiner*—James B. Mullins
*Attorney, Agent, or Firm*—Ira S. Dorman

[57] ABSTRACT

The method and apparatus of the invention effects compression of an analog electrical signal (e.g., representing an interferogram) by introducing into it a component that is a cubic function thereof, normally as a nonlinear negative signal in a feedback loop of an Op Amp. The compressed signal will most desirably be digitized and then digitally decompressed so as to produce a signal that emulates the original.

20 Claims, 6 Drawing Sheets

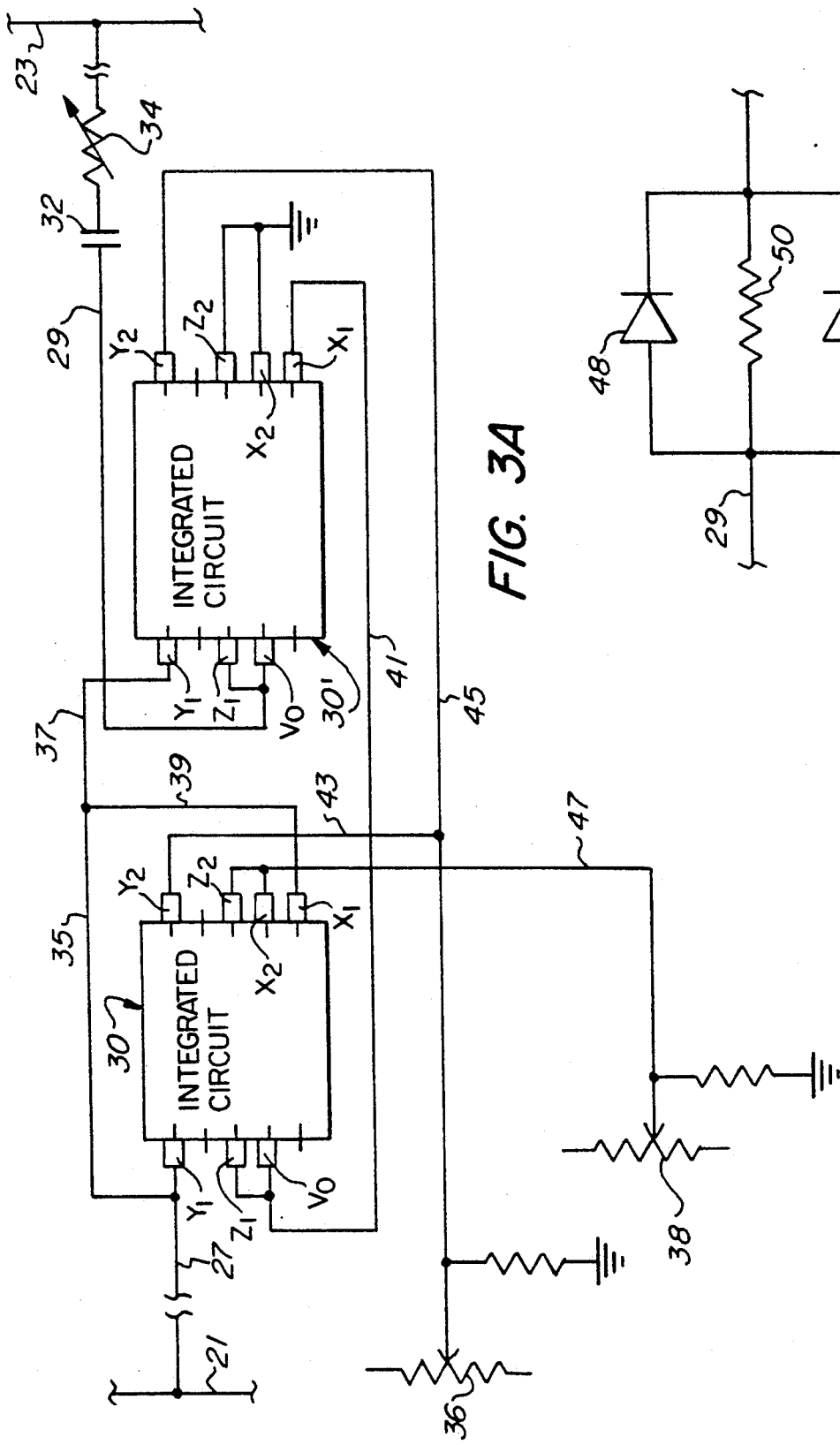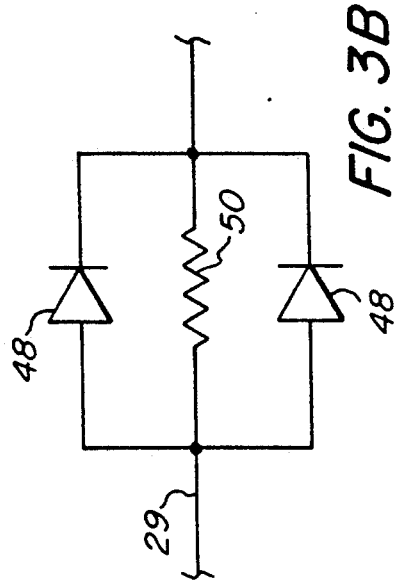

METHOD AND APPARATUS FOR SIGNAL COMPRESSION

The United States Government has rights in this invention pursuant to Contract No. DE-AC01-88ER80561, awarded by the Department of Energy.

BACKGROUND OF THE INVENTION

Generated analog electrical signals are of course commonly converted and utilized in digital form. In a variety of such schemes the signal-to-noise ratio (S/N) of the signal-generating device is much better than is the dynamic range of the associated analog-to-digital (A/D) convertor. This is true, for example, in Fourier transform infrared (FT-IR) spectrometers, in which a mercury cadmium telluride (MCT) photoconductive detector is typically used for detecting radiation in the mid-infrared region of the spectrum. Most such FT-IR instruments have 16-bit A/D convertors for digitizing the amplified MCT signal; because of the relatively high S/N of the detector, however, digitization of its signals by a 20-bit convertor is feasible.

An FT-IR spectrometer will typically generate an A.C. signal that, for the most part, oscillates about zero but that has a small region (the "center burst") near the zero path difference (ZPD) at which the signal peaks to 100 to 1000 times that level. Consequently, it is conventional to enhance the dynamic range of the FT-IR signal by gain ranging; that is, to set the amplification gain to some known, relatively high level during data acquisition, and to decrease it to some other known level in the region of the ZPD so as to avoid overloading of the A/D convertor. The technique is however disadvantageous for a number of reasons. Not only must the two gain levels be known very accurately, but there is also a tendency for switching noise generation because the data-acquisition rate can often exceed tens of kilohertz, thus subjecting the switch to fast settling time demands; it is very difficult, moreover, to remove the slight offsets from zero that can occur during the amplification changes.

The prior art teaches various means for effecting signal compression. Nonlinear devices, such diodes, transistors and FET's, have for example been incorporated into the feedback loops of Op Amps, as in U.S. Pat. No. 4,899,115, issued to Christian on Feb. 6, 1990, and U.S. Pat. No. 4,627,094, issued to Scholz on Dec. 2, 1986. U.S. Pat. No. 4,349,787, issued to Laupman on Sep. 14, 1982, and U.S. Pat. No. 4,400,583, issued to Bloy on Aug. 23, 1983, provide apparatus in which devices incorporated into amplifier feedback loops serve as adjustable gain controls, which are in turn controlled by other, secondary sensing circuitry.

These prior art compression algorithms also suffer however from certain deficiencies and drawbacks, rendering them unsuitable or unusable for many applications, including that to which the instant invention is (in its preferred embodiments) directed. This is attributable primarily to the fact that the compression functions of the devices involved are either insufficiently known, are susceptible to temperature changes, or are time averaged, thus making computation of the digitized signal, and emulation of the original uncompressed signal, inconsistent and difficult, if indeed possible at all.

Accordingly, it is the broad object of the present invention to provide a novel method, apparatus and system for enhancing analog electrical signal properties, by compression.

More specific objects are to provide such a method, apparatus and system by which the signal-to-noise ratio of the signal can be maximized so as to make use of the entire dynamic range of a digitizer, and to provide a method and system for digitally decompressing the signal so as to faithfully emulate the original, uncompressed signal.

Additional objects of the invention are to provide such a method, apparatus and system in which compression is effected in a manner that is highly efficient and effective, and by means that is relatively incomplex, highly reliable, stable, convenient to calibrate and utilize, and relatively inexpensive and facile to produce.

SUMMARY OF THE INVENTION

It has now been found that certain of the foregoing and related objects of the invention are attained by the provision of a method for effecting compression of an electrical signal, comprising the steps: generating an input analog electrical signal having a time-varying amplitude feature; effecting linear amplification of the input signal to produce an output signal; and introducing into the input signal a nonlinear negative feedback signal having at least a component that is a cubic function of the output signal.

The input signal involved will normally be an A.C. signal, preferably one that is representative of an interferogram, and the feedback signal will most desirably additionally include a component that is a linear function of the output signal. In especially preferred embodiments, the compressed output signal will be subjected to decompression to emulate the input signal. Decompression will desirably be carried out by application of the formula:

$$S_D = \frac{A}{B}(S_O) + \frac{A}{f}[(S_O)^3/D - C],$$

wherein "$S_D$" and "$S_O$" are the decompressed signal and the compressed output signal, respectively, wherein the terms "A," "B," "D," and "f" are numerical coefficients, the coefficient A being of either positive or negative value, and wherein the value of the term "C" is established as necessary for noise filtration, and is either zero, or varies as a function of $(S_O)^3$ and is qualitatively the same as $(S_O)^3$. In most instances, "$S_D$" and "$S_O$" will represent voltage values, the coefficients A, B and f will be resistance values, and D will represent an amplifier scaling factor.

The steps of amplification of the input signal, and of introducing the feedback signal, will advantageously be effected using an electronic operational amplifier having a feedback loop, between its output and inverting input terminals, incorporating the signal cubing circuit means. The method will generally include an additional step of converting the output signal to digital form and most desirably the digitized output signal will be subjected to decompression, by digital means, to emulate the input signal.

Other objects of the invention are attained by the provision of compression apparatus, comprising linear amplification means for amplifying an input electrical signal having a time-varying amplitude feature, and means for generating, and for introducing into the input signal, a nonlinear negative feedback signal having a component that is a cubic function of the output signal.

The amplification means will desirably take the form of an electronic operational amplifier, with the means for generating and introducing comprising electronic cubing circuit means in its feedback loop. The cubing circuit means will desirably comprise two substantially identical integrated circuit components, so interconnected and so connected in the Op Amp feedback loop as to generate the necessary cubic function component. Linear calibrating means may also be provided for temporary operative substitution into the feedback loop, in place of the cubing circuit means, so as to produce a negative feedback signal component that is a strictly linear function of the output signal.

Additional objects of the invention are attained by providing a system for producing a digitized analog signal, which comprises means for generating an input analog electrical signal having a time-varying amplitude feature; apparatus for effecting compression of the input signal; means for converting the compressed output signal to digital form; and means for effecting digital decompression of the digitized, compressed output signal so as to produce a signal that emulates the input signal. The apparatus used for effecting compression will desirably take the form, and have the features, described herein.

In preferred embodiments of the system, the analog signal-generating means will produce a signal that represents an interferogram, and it will normally comprise a photoconductive detector, preferably of the mercury cadmium telluride type. The system will most desirably comprise a Fourier transform spectrometer, providing not only the analog signal-generating means but also digital, electronic data processing means (i.e., its computer) for effecting signal decompression.

BRIEF DESCRIPTION OF THE DRAWINGS

FIG. 3A is a schematic diagram illustrating a cubic signal generator suitable for use in the apparatus of the preceding Figure;

FIG. 3B is a schematic diagram of a noise filtering network desirably incorporated into the circuitry of FIG. 3A;

DETAILED DESCRIPTION OF THE PREFERRED AND ILLUSTRATED EMBODIMENTS

Figure 1:
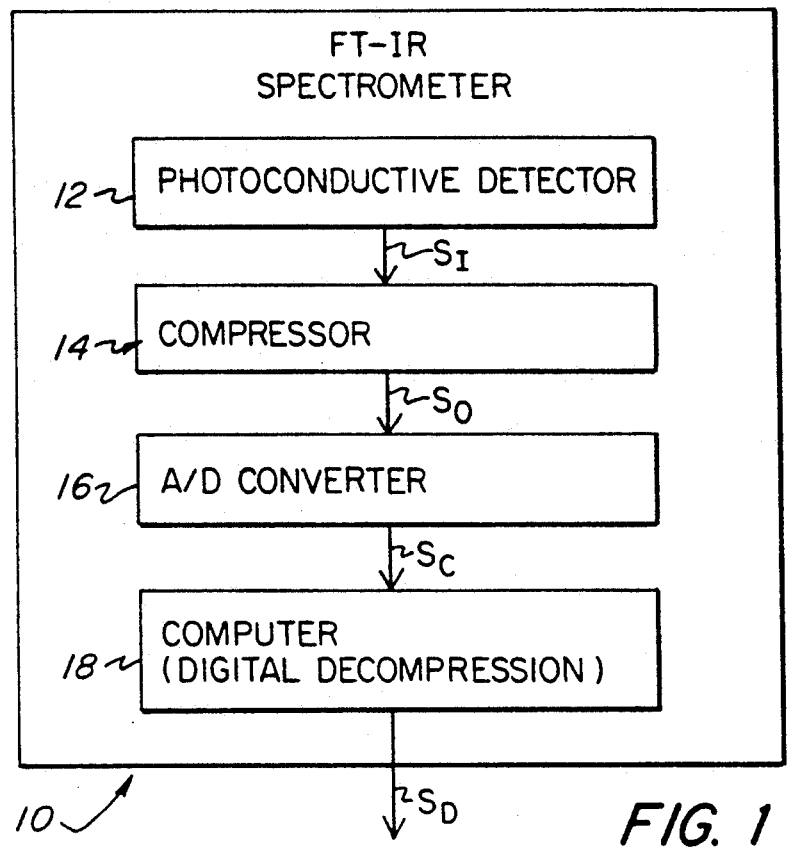
FIG. 1 of the drawings is a schematic diagram of a system embodying the present invention.

Turning now in detail to FIG. 1 of the appended drawings, therein illustrated schematically is a system embodying the present invention and taking the form of a Fourier-transform infrared spectrometer, generally designated by the numeral 10. Such spectrometers conventionally include a photoconductive detector 12 (typically, an MCT detector), a 16-bit A/D convertor 16, and a digital computer 18 (in addition of course to other components, including a modulated radiation source, transfer optics, a sample compartment, etc., as will be appreciated by those skilled in the art). In accordance with the instant invention, however, the FT-IR is modified by the incorporation of a signal compressor, generally designated by the numeral 14 and to be more fully described hereinbelow. Suffice to say here that the photoconductive detector 12 generates an analog electrical input signal $S_I$ having a time-varying amplitude feature (i.e., an A.C. signal that oscillates about zero), which is subjected to compression to produce a compressed output signal $S_O$, is thereafter subjected to A/D conversion to produce a digitized converted signal $S_C$. and is finally subjected to digital decompression to produce the decompressed signal $S_D$, emulating the input signal $S_I$.

Figure 2:
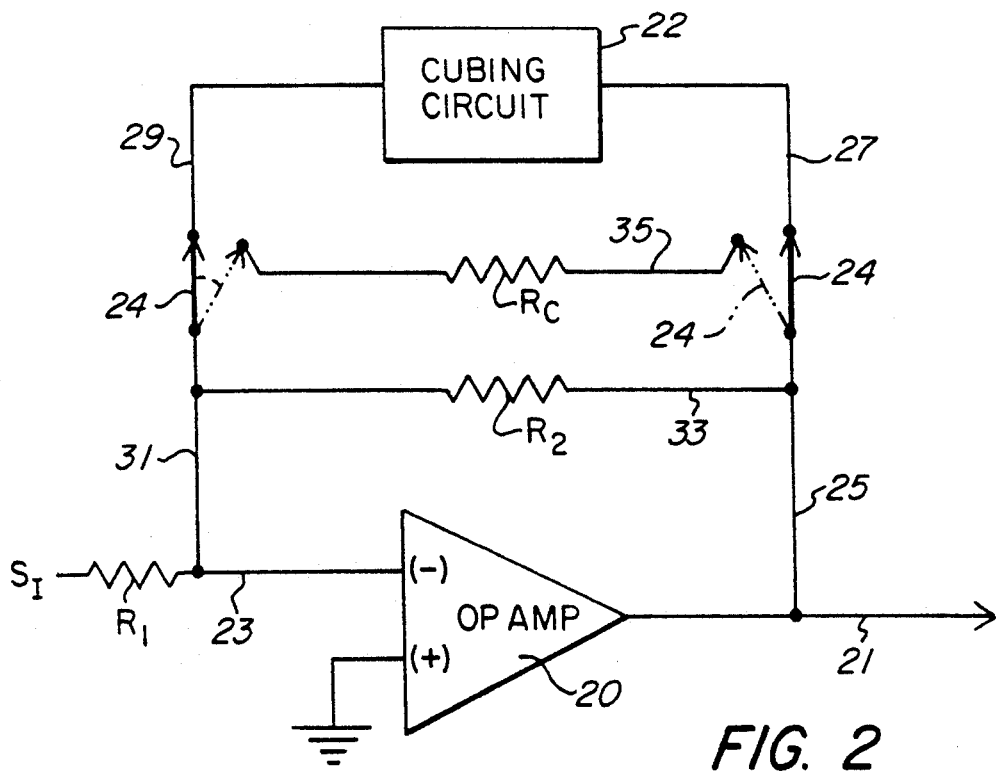
FIG. 2 is a schematic diagram of an amplification stage constituting signal compression apparatus embodying the invention.

FIG. 2 illustrates an amplification stage that is incorporated into the FT-IR 10, for performing the compression function required in accordance with the instant invention. As can be seen, the feedback loop of the Op Amp 20 includes a cubing circuit, generally designated by the numeral 22, connected in parallel with a resistor $R_2$. These components act upon the output signal $S_O$, passing from line 21 through lines 25, 27 and 33, to produce negative feedback currents which pass through lines 29 and 31 to join the current of the input signal $S_I$ (subjected to line resistance $R_1$) at the node in line 23 and the inverting terminal of the Op Amp 20. The circuit also includes a calibration resistor $R_C$, which can be substituted for the cubing circuit 22 by movement of the switch 24 to the alternative position shown by the dotted line representations.

The cubing circuit 22 is illustrated in greater detail in FIG. 3A, and consists essentially of two integrated circuit chips, generally designated by the numerals 30 and 30'; each chip is suitably an MPY 100 multiplier chip, commercially available from Burr-Brown Research Corporation of Tucson, Ariz. Line 27 (operatively connected to the Op Amp output signal line 21) is connected to terminal $Y_1$ of both chips 30, 30' (through line 35 and, in the latter instance, line 37 as well); line 27 is also connected to terminal $X_1$ of chip 30 through line 39. The output terminal $V_0$ and terminal $Z_1$ of chip 30 are connected to terminal $X_1$ of chip 30' through line 41, and terminals $V_0$ and $Z_1$ of chip 30' are operatively connected to line 23 (the Op Amp input line) through line 29, capacitor 32, and variable resistor 34. Line 45 connects terminal $Y_2$ of chip 30', and terminals $X_2$ and $Y_2$ of chip 30 (through line 43), to voltage divider 36, and line 47 connects terminal $Z_2$ of chip 30 to a second voltage divider 38; terminals $X_2$ and $Z_2$ of chip 30' are grounded. The voltage dividers 36 and 38 (across which a potential of 15 volts is typically applied) enable adjustments for symmetry and to establish a zero derivative at inflection; capacitor 32 serves to bias the circuit output voltage about zero, and the variable resistor 34 is utilized to optimize the circuit for operation upon the input signal.

The transfer equation for the MPY 100 chips 30, 30', used in the embodiment illustrated in FIG. 3A, is:

$$V_0 = a[(X_1 - X_2)(Y_1 - Y_2)/10V + (Z_2 - Z_1)]$$

in which "a" is the amplification gain of the chip, and in which division of the product $(X_1 - X_2)(Y_1 - Y_2)$ by 10 volts is an inherent chip characteristic (providing a scaling factor "D" of 100 for the chip combination) As will be appreciated, the value of the linear coefficient "A/B" in the decompression formula hereinabove set forth will equal the ratio of the resistances in the input line and the feedback loop, respectively (i.e., $R_1/R_2$), and the value of the cubic coefficient "A/f" will be an established function of the input line resistance $R_1$ and resistor 34. The circuit is calibrated by collecting data with the calibration resistor $R_C$ connected in the feedback loop of the Op Amp 20 (the cubing circuit 22 being disconnected). The variable resistor 34 is then adjusted with the cubing circuit 22 substituted for the calibration resistor, so as to produce as strong a signal as possible without exceeding acceptable values for the circuit (i.e., without overloading it), thereby establishing a value for "f".

FIG. 3B illustrates a network that is desirably incorporated into the circuitry of FIG. 3A, operatively connected between the variable resistor 34 and line 23 (i.e., in line 29 of FIG. 2). It consists of two diodes 48 and a high-value resistor 50. At low signal levels, where noise is of concern, the diodes 48 will function as very high resistances, preventing noise generated by the integrated circuits 30, 30' from being injected into, and amplified by, the Op Amp 20. Higher level signals will pass through the diode network, but will be subject to the voltage drop thereacross. The resistor 50 serves simply to prevent a bias from forming across the diodes.

As to the "C" term of the decompression formula given hereinabove, except in low noise embodiments of the invention it will be zero, and decompression will therefore be carried out by application of the formulation:

$$S_D = \frac{A}{B}(S_O) + \frac{A}{f}[(S_O)^3/D],$$

the terms of which are as previously defined. Otherwise (i.e., when the dynamic range of the incoming signal exceeds that of the cubing circuit), C will vary as a function of $(S_o)^3/D$; taking the voltage drop across the diode network of FIG. 3B to be "$V_D$", C will equal negative $V_D$ when $(S_o)^3/D$ has a value equal to or less than negative $V_D$, C will equal positive $V_D$ when $(S_o)^3/D$ has a value equal to or greater than positive $V_D$, and C will equal $(S_o)^3/D$ when $(S_o)^3/D$ has a value between negative and positive $V_D$. Because C may attain a value equal to $(S_o)^3/D$, and may thereby eliminate the cubic component from the feedback signal, the decompression algorithm hereinabove set forth is applicable under low-noise as well as high noise conditions.

Figure 4A:
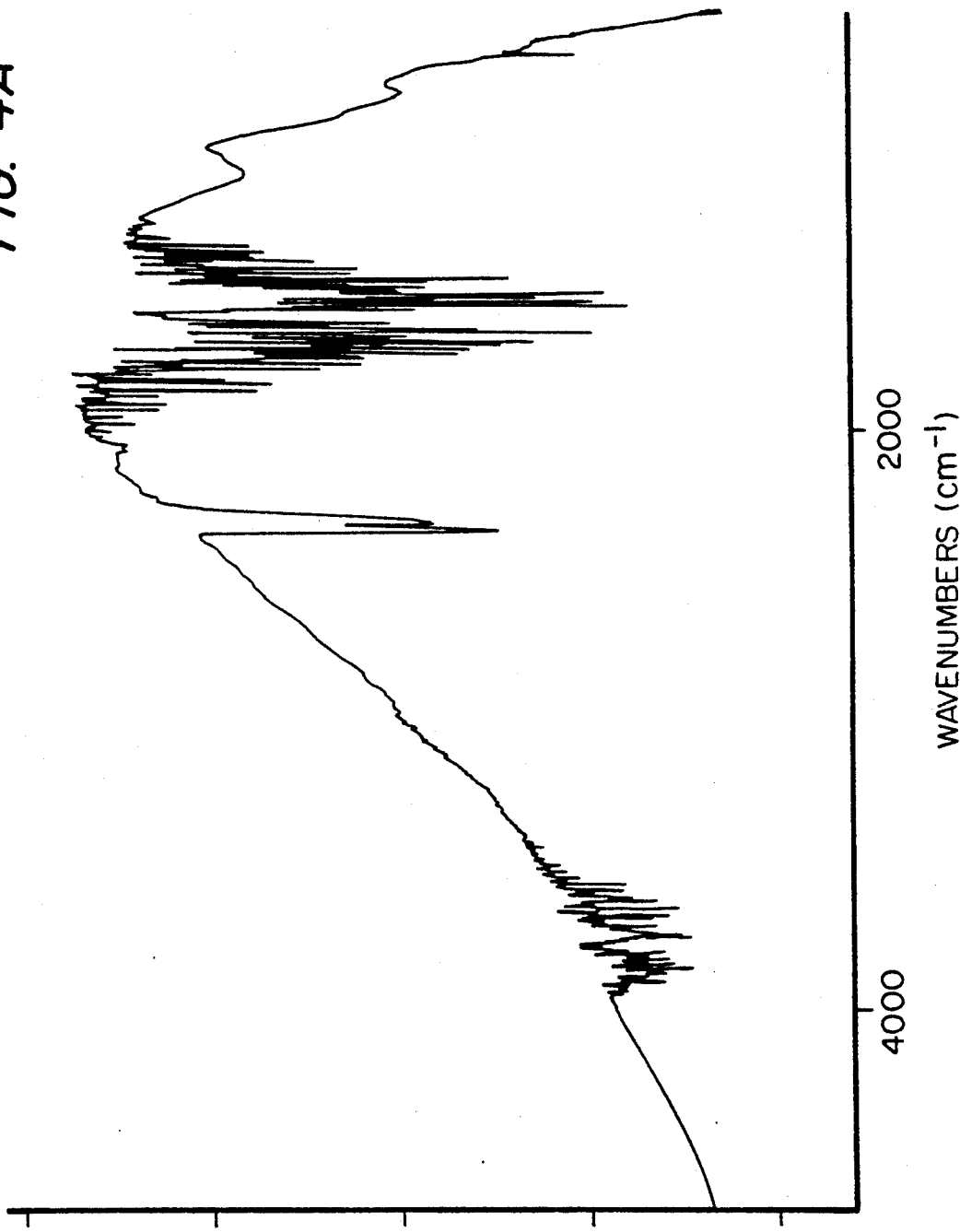
FIGS. 4A and 4B are single beam scans from fast Fourier transforms (FFT's) of interferograms from an FT-IR spectrometer subjected, respectively, to linear signal amplification, and to amplification with signal compression in accordance with the present invention.
Figure 4B:
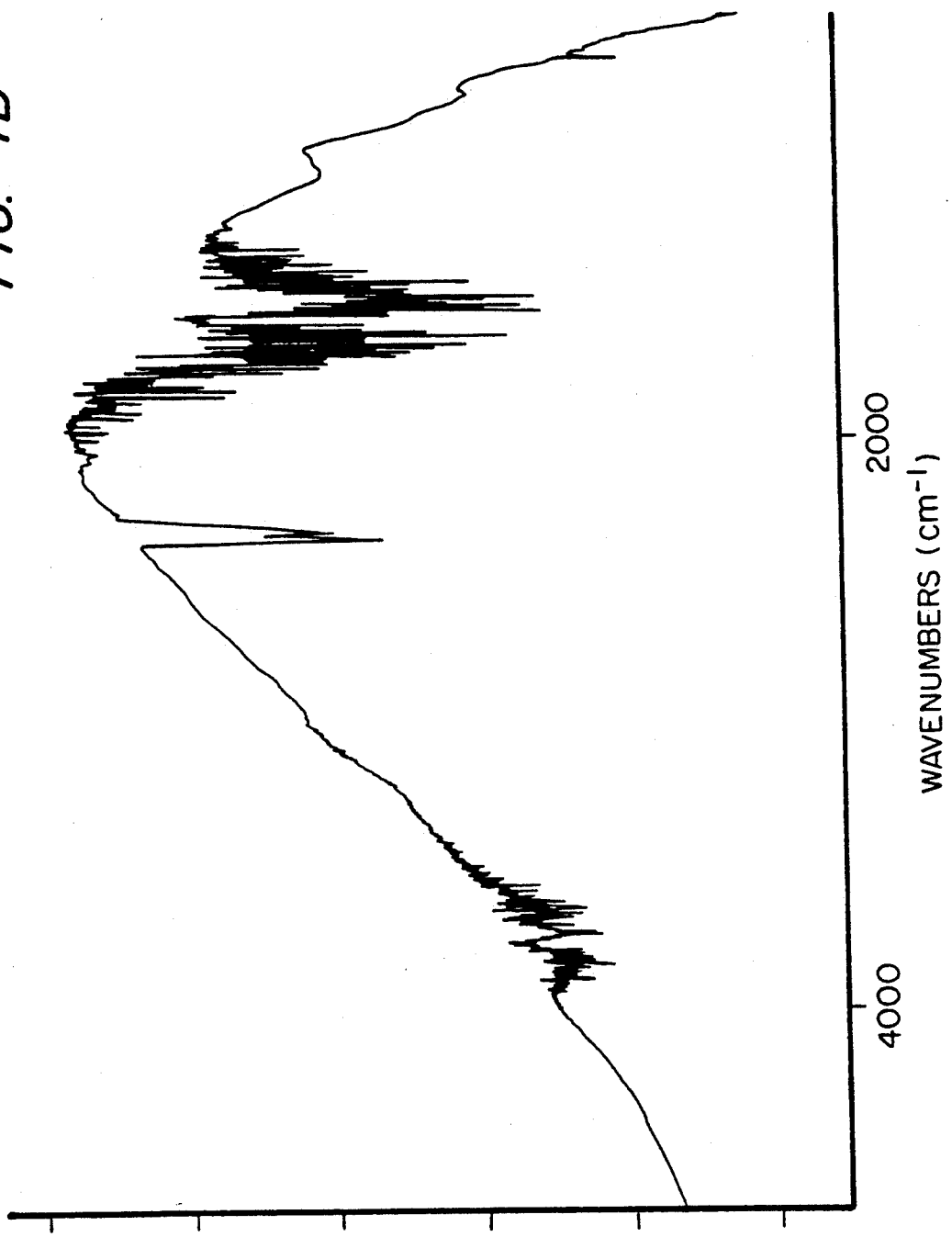
Figure 5A:
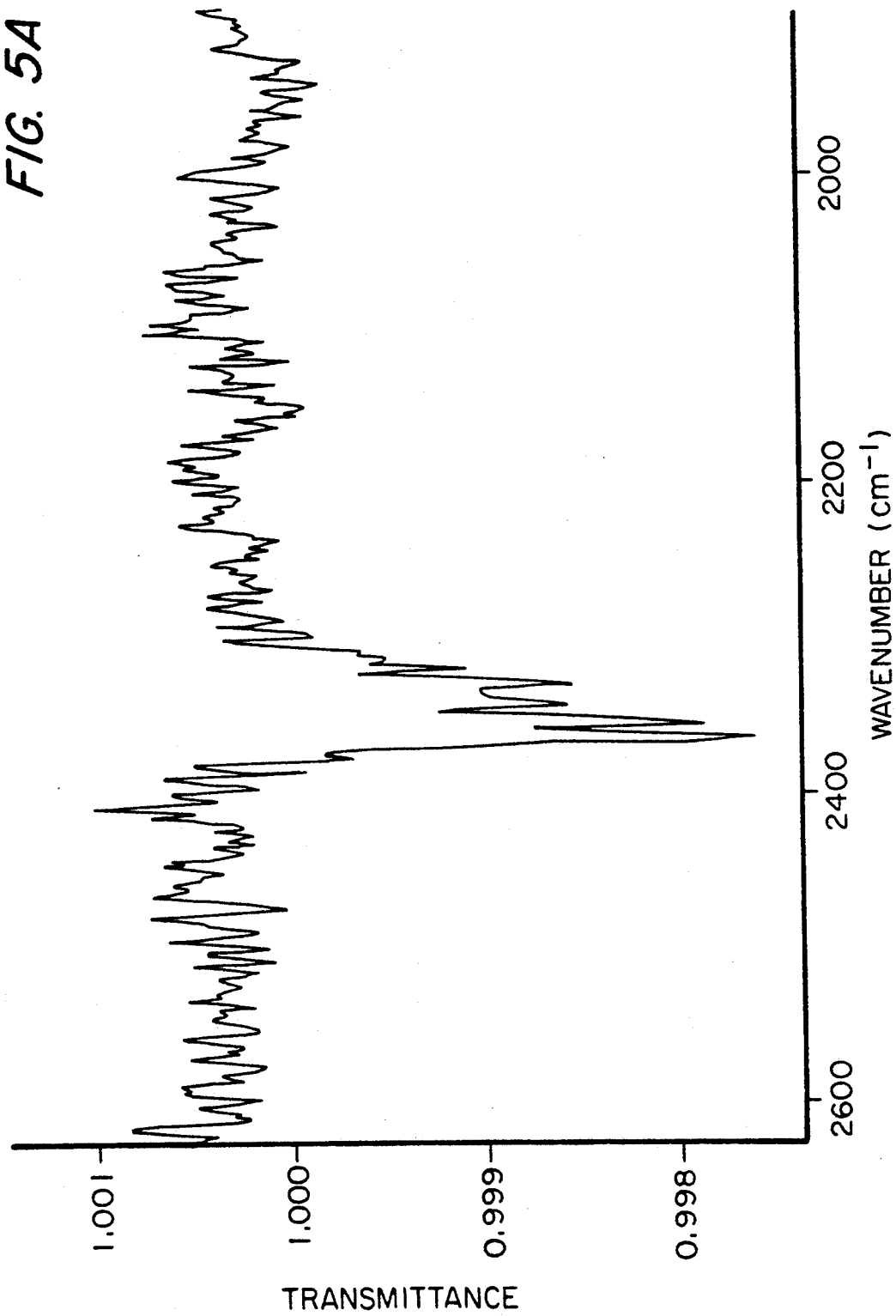
FIGS. 5A and 5B are transmission spectra obtained by ratioing two single beam spectra taken, in the case of FIG. 5A, with linear signal amplification and, in the case of FIG. 5B, with signal compression in accordance with the instant invention.
Figure 5B:
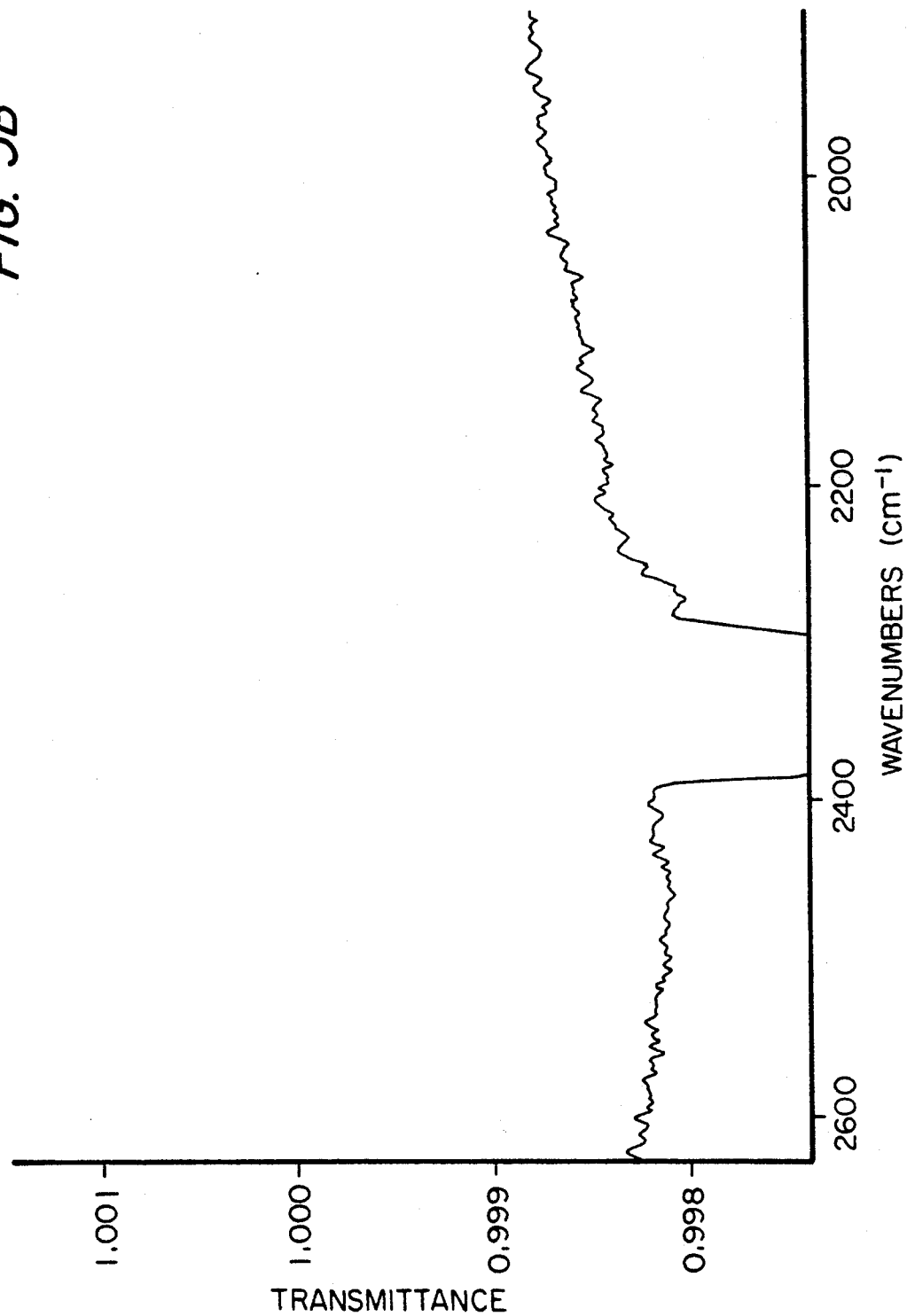

The FFT scans of FIGS. 4A and 4B are plotted with the same, arbitrary ordinate scale units. It will be appreciated that the curves show negligible differences, indicating that the technique of the invention does not introduce artifacts into the signal. The transmission scans of FIGS. 5A and 5B are ratios of single beam scans, and demonstrate (in FIG. 5B) the level of signal noise reduction (from the scan of FIG. 5A) that can be achieved by implementation of the method and apparatus of the invention. More specifically, use of the present technique has been found to increase the S/N of such a signal by a factor of about 8, and it is believed that factors as high as 20 or more may be possible through further optimization.

Thus, the present invention readily enables compression of an analog signal for use by an A/D convertor, the digitized signal from which can be digitally decompressed so as to emulate highly accurately the original input signal. For these purposes the compression function must be simple and smooth, readily adjusted, free from time delays, and capable of operating, on A.C. signals, symmetrically about zero. The compression function must moreover be very stable, especially for low amplitude signals, and must be adapted for facile decompression. All of these requirements are satisfied in the instant method, apparatus and system.

More particularly, in the circuit illustrated the resistor R: serves to control the gain for very low signal levels, since the cubing circuit 22 produces almost zero current in operating thereupon; the gain is therefore very linear and stable for such signals. Higher levels of feedback are produced by the cubing circuit as signal levels increase in amplitude, thus introducing the required non-linear feedback and compressing the signal with an effect that is symmetric about zero. The decompression formula provided above shows that the original signal may readily be computed from the compressed output signal. (The compression formula is of course the same, but with the input signal $S_I$ substituted for the decompressed signal term $S_D$, and from which the output signal $S_O$ could be calculated, if so desired.) And finally, it should be noted that electronic components are available, for use in the cubing circuit (the slowest portion of the device), which can operate on signals at a rate in excess of one megahertz, thereby producing circuits having very fast response times.

It will of course be appreciated by those skilled in the art that the circuitry illustrated and described herein are merely exemplary, and that equivalent means can in all instances be substituted. Also, in those cases in which the system involved is an analytical instrument or similar device, the compression apparatus may either be incorporated by the manufacturer or it may be designed and built as an add-on unit.

Thus, it can be seen that the present invention provides a novel method, apparatus and system for enhancing analog electrical signal properties, by compression. In accordance with it the S/N of the signal can be maximized prior to digitization, thereby enabling the entire dynamic range of the digitizer to be used, and the signal can readily be digitally decompressed so as to faithfully emulate the original signal. Compression is effected in a highly efficient and effective manner, and the means used is relatively incomplex, highly reliable, stable, convenient to calibrate and utilize, and relatively inexpensive and facile to produce.

Having thus described the invention, what is claimed is:

1. In a method for effecting compression of an electrical signal, the steps comprising:
    generating an input analog electrical signal having a time-varying amplitude feature;
    effecting linear amplification of said input signal to produce an output signal;
    introducing into said input signal a nonlinear negative feedback signal having a component that is a cubic function of said output signal;
    converting said output signal to digital form; and
    subjecting said digital form of said output signal to digital decompression to emulate said input signal.

2. The method of claim 1 wherein said input signal is an A.C. signal.

3. The method of claim 2 wherein said input signal represents an interferogram.

4. The method of claim 2 wherein said steps of amplification and introducing are effected using an electronic operational amplifier having a feedback loop between the output and inverting input terminals thereof, said feedback loop comprising signal cubing circuit means.

5. The method of claim 1 wherein said feedback signal additionally includes a component that is a linear function of said output signal.

6. In a method for effecting compression of an electrical signal, the steps comprising:
  generating an input analog electrical signal having a time-varying amplitude feature;
  effecting linear amplification of said input signal to produce an output signal;
  introducing into said input signal a nonlinear negative feedback signal having a component that is a cubic function of said output signal; and
  subjecting said output signal to decompression to emulate said input signal, said step of decompression being carried out by application of the formula:

$$S_D = \frac{A}{B}(S_O) + \frac{A}{f}[(S_O)^3/D - C],$$

wherein "$S_O$" is said output signal, wherein $S_D$ is the decompressed signal, Wherein the terms "A," "B," "D," and "f" are numerical coefficients, said coefficient A having either a positive or a negative value, and wherein the value of the term "C" is established as necessary for noise filtration, and is either zero, or varies as a function of $(S_O)^3$ and is qualitatively the same as $(S_O)^3$.

7. The method of claim 6 wherein "$S_D$" and "$S_O$" are voltage values, and wherein said coefficients are resistance values.

8. Apparatus for effecting the compression of an electrical signal, comprising:
  linear amplification means for amplifying an input electrical signal having a time-varying amplitude feature;
  means for generating, and for introducing into said input signal, a nonlinear negative feedback signal having a component that is a cubic function of said output signal, said amplification means being an electronic operational amplifier having a feedback loop between the output and inverting input terminals thereof, and said means for generating and introducing comprising electronic cubing circuit means in said feedback loop;
  linear calibrating means and
  means for selectively disconnecting said cubing circuit means from said feedback loop and for effecting temporary operative substitution of said calibrating means into said feedback loop, in place of said cubing circuit means, said calibrating means producing, when so substituted, a negative feedback signal component that is only a linear function of said output signal.

9. The apparatus of claim 8 wherein said means for generating and introducing additionally includes linear response means, in said feedback loop, for producing a component of said feedback signal that is a linear function of said output signal.

10. The apparatus of claim 8 wherein said cubing circuit means comprises at least one integrated circuit component.

11. The apparatus of claim 8 wherein said cubing circuit means comprises two substantially identical integrated circuit components, said circuit components being so interconnected and connected in said feedback loop as to generate said cubic function component of said feedback signal.

12. A system for producing a digitized analog signal, comprising:
  means for generating an input analog electrical signal having a time-varying amplitude feature;
  apparatus for effecting the compression of said input signal, so as to produce a compressed output signal, said apparatus comprising linear amplification means for amplifying said input signal, and means for generating, and for introducing into said input signal, a nonlinear negative feedback signal having a component that is a cubic function of said output signal;
  convertor means for converting said output signal to digital form; and
  decompression means for effecting digital decompression of said output signal, so as to produce a signal that emulates said input signal.

13. The system of claim 12 wherein said amplification means is an electronic operational amplifier having a feedback loop between the output and inverting input terminals thereof, and wherein said means for generating and introducing comprises electronic cubing circuit means in said feedback loop.

14. The system of claim 13 wherein said means for generating and introducing additionally includes linear response means, in said feedback loop, for producing a component of said feedback signal that is a linear function of said output signal.

15. The system of claim 14 wherein said means for generating and introducing additionally includes means in said feedback loop for filtering noise generated by said cubing circuit means.

16. The system of claim 15 wherein said decompression means implements the formula:

$$S_D = \frac{A}{B}(S_O) + \frac{A}{f}[(S_O)^3/D - C],$$

wherein "$S_O$" is said output signal, wherein $S_D$ is the decompressed signal, wherein $S_O$ and $S_D$ are voltage values, wherein the terms "A," "B," "D," and "f" are numerical coefficients and are values of resistances in said apparatus, said coefficient A having either a positive or a negative value, and wherein the value of the term "C" is established as necessary for noise filtration, and is either zero or varies as a function of $(S_O)^3$ and is qualitatively the same as $(S_O)^3$.

17. The system of claim 12 wherein said convertor means is a 16-bit analog-to-digital conversion device.

18. A system for producing a digitized analog signal, comprising:
  a Fourier transform spectrometer providing means for generating an input analog A.C. electrical signal representing an interferogram and having a time-varying amplitude feature, and providing a photoconductive detector and a digital computer, said signal oscillating about zero and having a small peak region;

apparatus for effecting the compression of said input signal, so as to produce a compressed output signal; and convertor means for converting said output signal to digital form, said digital computer providing means for effecting digital decompression of said output signal so as to produce a signal that emulates said input signal.

19. The system of claim 18 wherein said detector is a mercury cadmium telluride device.

20. A system for producing a digitized analog signal, comprising:

means for generating an input analog electrical signal having a time-varying amplitude feature;

apparatus for effecting the compression of said input signal, so as to produce a compressed output signal;

convertor means for converting said output signal to digital form; and decompression means for effecting digital decompression of said output signal so as to produce a signal that emulates said input signal, said decompression means implementing the formula:

$$S_D = \frac{A}{B}(S_O) + \frac{A}{f}[(S_O)^3/D - C],$$

wherein "$S_O$" is said output signal, wherein $S_D$ is the decompressed signal, wherein $S_O$ and $S_D$ are voltage values, wherein the terms "A," "B," "D," and "f" are numerical coefficients and are values of resistances in said apparatus, said coefficient A having either a positive or a negative value, and wherein the value of the term "C" is established as necessary for noise filtration, and is either zero or varies as a function of $(S_O)^3$ and is qualitatively the same as $(S_O)^3$.

* * * * *